(12) United States Patent
Suzuki et al.

(10) Patent No.: US 7,956,380 B2
(45) Date of Patent: Jun. 7, 2011

(54) SEMICONDUCTOR LIGHT-EMITTING DEVICE

(75) Inventors: Jun Suzuki, Kanagawa (JP); Masato Doi, Kanagawa (JP); Goshi Biwa, Kanagawa (JP); Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 63 days.

(21) Appl. No.: 11/331,290

(22) Filed: Jan. 12, 2006

(65) Prior Publication Data
US 2006/0170001 A1 Aug. 3, 2006

(30) Foreign Application Priority Data

Jan. 18, 2005 (JP) .................................. 2005-010617

(51) Int. Cl.
*H01L 33/00* (2010.01)
(52) U.S. Cl. ............. 257/101; 257/103; 438/22; 438/37
(58) Field of Classification Search .................... 257/57, 257/59, 66, 72, 347, 350, 35, 101–103
See application file for complete search history.

(56) References Cited

U.S. PATENT DOCUMENTS

| | | | | |
|---|---|---|---|---|
| 6,989,555 B2* | 1/2006 | Goetz et al. | ................... | 257/103 |
| 2001/0011733 A1* | 8/2001 | Mukai et al. | ................... | 257/190 |
| 2004/0137657 A1* | 7/2004 | Dmitriev et al. | ................ | 438/47 |
| 2004/0169184 A1* | 9/2004 | Udagawa et al. | ............... | 257/86 |
| 2005/0040425 A1* | 2/2005 | Akita | ............................ | 257/103 |
| 2005/0042787 A1* | 2/2005 | Ito et al. | ........................... | 438/41 |
| 2005/0072986 A1* | 4/2005 | Sasaoka | ........................ | 257/103 |
| 2005/0121688 A1* | 6/2005 | Nagai et al. | ..................... | 257/99 |
| 2006/0110839 A1* | 5/2006 | Dawson et al. | ................. | 438/22 |
| 2006/0138431 A1* | 6/2006 | Dwilinski et al. | .............. | 257/79 |

FOREIGN PATENT DOCUMENTS

| | | |
|---|---|---|
| JP | 11-186598 | 9/1999 |
| JP | 2001-352133 | 12/2001 |
| JP | 2004-336078 | 11/2004 |
| WO | WO 03098757 | * 11/2003 |

OTHER PUBLICATIONS

Japanese Office Action issued on May 11, 2010, for corresponding Japanese Patent Application No. 2005-010617.

* cited by examiner

*Primary Examiner* — Thanh V Pham
*Assistant Examiner* — Tony Tran
(74) *Attorney, Agent, or Firm* — K&L Gates LLP

(57) ABSTRACT

A semiconductor light-emitting device is provided. In an InGaN-based semiconductor light-emitting device including an Ag electrode, a semiconductor layer on the contact side of at least the Ag electrode is a dislocation semiconductor layer of which dislocation density is selected to be less than $1 \times 10^7$ $(1/cm^2)$ and thereby short-circuit caused by Ag migration generated along this dislocation can be avoided. Thus, this semiconductor light-emitting device is able to solve a problem of a shortened life and a problem with the fraction of defective devices encountered with the InGaN-based semiconductor light-emitting device.

4 Claims, 2 Drawing Sheets

SEMICONDUCTOR LIGHT-EMITTING DEVICE

CROSS REFERENCES TO RELATED APPLICATIONS

The present application claims priority to Japanese Patent Application JP 2005-010617 filed in the Japanese Patent Office on Jan. 18, 2005, the entire contents of which being incorporated herein by reference.

BACKGROUND

The present invention generally relates to a semiconductor light-emitting device, and particularly to an InGaN-based semiconductor light-emitting device.

FIG. 1 of the accompanying drawings is a schematic cross-sectional view showing an example of a related art InGaN-based semiconductor light-emitting diode which is a green or blue light-emitting diode of which active layer is formed of InGaN-based semiconductor layer.

As shown in FIG. 1, this InGaN-based semiconductor light-emitting diode includes a light-emitting function portion 34 composed of an n type GaN first cladding layer 31, an InGaN-based active layer 32 and a p type GaN second conductivity type second cladding layer 33 laminated in that order from below and first and second electrodes 41 and 42 deposited on the n type GaN first cladding layer 31 and the p type GaN second conductivity type second cladding layer 33.

In this semiconductor light-emitting diode, there can be applied a structure in which the p type side electrode is formed of an Ag electrode with high reflectance (see Gazette of Japanese laid-open patent application No. 11-186598). As described above, when the second electrode 42 of the side of the second cladding layer 33 is constructed by the Ag electrode, it is possible to increase luminous efficiency by emitting light from the first cladding layer 31 side opposite to the side of the second cladding layer 33.

However, according to this arrangement, problems arise, in which the life of the semiconductor light-emitting device is as short as approximately several seconds and the of fraction defective devices is increased. Official Gazette of Japanese laid-open patent application No. 11-186598

SUMMARY

In view of the aspects described above, a semiconductor light-emitting device is provided in which the problem reduced life and the problem of a fraction of defective devices encountered with the above-mentioned semiconductor light-emitting device, in particular, an InGaN-based semiconductor light-emitting device can be solved.

Moreover, according to an embodiment, it has been investigated that the above-mentioned problem of life is caused by the migration of Ag from the Ag electrode. Also, according to an embodiment, a cause in which the migration occurs has been studied and the present invention has created an arrangement which can effectively avoid the occurrence of the above-mentioned migration. Therefore, this embodiment provides a semiconductor light-emitting device formed of a semiconductor light-emitting diode having the above-mentioned arrangement.

According to an embodiment, there is provided, in an InGaN-based semiconductor light-emitting device including an Ag electrode, a semiconductor light-emitting device comprising a semiconductor layer formed on the contact side of at least the Ag electrode, wherein the semiconductor layer is formed of a low dislocation semiconductor layer of which dislocation density is less than $1 \times 10^7$ ($1/cm^2$).

In the semiconductor light-emitting device according to an embodiment, the InGaN-based semiconductor light-emitting device includes a laminated epitaxial growth layer including at least a first cladding layer, an active layer and a second cladding layer, the laminated epitaxial growth layer being composed of a low dislocation epitaxial growth layer formed by an ELO (epitaxial lateral overgrowth) method.

Further, in the semiconductor light-emitting device according to an embodiment, the InGaN-based semiconductor light-emitting device is composed of a low dislocation epitaxial growth method in which a laminated epitaxial growth layer including at least a first cladding layer, an active layer and a second cladding layer is formed on a GaN substrate.

Furthermore, in the semiconductor light-emitting device according to an embodiment, the semiconductor light-emitting device is less than about 20 µm in diameter or length of side of its plane dimension.

According to the above-mentioned semiconductor light-emitting device, it was confirmed that the life of the semiconductor light-emitting device could be prolonged.

That is, it was investigated that the life of the semiconductor light-emitting device is shortened due to the Ag migration caused by the Ag electrode. Also, this Ag migration occurs in such a manner that Ag is moved along the dislocations of the crystals produced in the semiconductor layer with which the Ag electrode comes in contact, specifically, the second cladding layer, that is, the migration occurs in such a manner that it may reach the active layer or it may be extended to the position close to the active layer so that, when the light-emitting diode is energized, an electric current path which short-circuits the Ag electrode and the active layer is formed, the electric current being concentrated in this electric current path, thereby the above-mentioned semiconductor light-emitting device being broken all at once.

On the other hand, according to an embodiment, when the semiconductor layer on the contact side of the Ag electrode is held at the low dislocation density, specifically, the dislocation density of this semiconductor layer is selected to be less than $1 \times 10^7$ ($1/cm^2$), the life of the semiconductor light-emitting device could be prolonged.

Then, in the semiconductor light-emitting device according to an embodiment, when the size of this semiconductor light-emitting device, that is, the plane dimension is selected to be less than 20 µm, the life of the semiconductor light-emitting device can be prolonged much more as the low dislocation density is selected and the existence of the dislocation is decreased owing to microminiaturization of the semiconductor light-emitting device. Also, the percent or fraction of defective semiconductor light-emitting devices can be decreased and accordingly the yield thereof can be improved.

In other words, while the plane dimension of the light-emitting diode element of the related art semiconductor light-emitting device has a square pattern in which each side, for example, is 350 µm, the light-emitting diode element according to an embodiment of the present invention has an arrangement in which the diameter thereof or the length of each side is selected to be less than about 20 µm, in cooperation with the synergy in which the dislocation density is lowered and the probability that the dislocation will exist is decreased, it is possible to effectively decrease the existence of the substantial dislocation.

Therefore, when this low dislocation semiconductor layer has the epitaxial growth layer deposited by the ELO method or it has the epitaxial growth arrangement which is lattice-matched in the GaN semiconductor layer deposited on the GaN substrate, it is possible to obtain the above-mentioned dislocation density less than $1\times10^7$ (1/cm$^2$).

Additional features and advantages are described herein, and will be apparent from, the following Detailed Description and the figures.

BRIEF DESCRIPTION OF THE FIGURES

FIG. 1 is a schematic cross-sectional view of a related art semiconductor light-emitting diode the;

DESCRIPTION

A semiconductor light-emitting device according to embodiments of the present invention will now be described with reference to the drawings. The semiconductor light-emitting device according to the present invention is formed of an InGaN-based semiconductor light-emitting device having an Ag electrode and an InGaN-based active layer. While an example of an InGaN semiconductor light-emitting device is hereinafter described as an embodiment of the semiconductor light-emitting device of the present invention, the structures and manufacturing procedures are not limited to the illustrated examples which follow.

Figure 1:
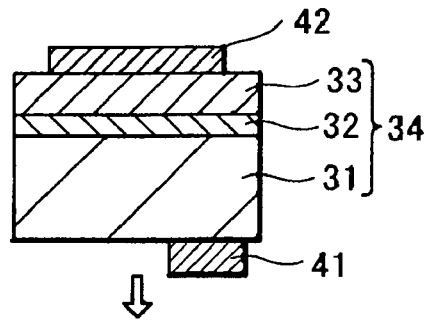
Figure 2:
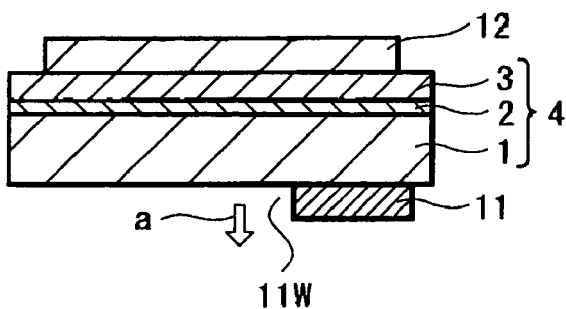
FIG. 2 is a schematic cross-sectional view of a semiconductor light-emitting device according to an embodiment of the present invention.

FIG. 2 is a schematic cross-sectional view showing an InGaN-based semiconductor light-emitting diode including an InGaN-based active layer according to an embodiment.

As shown in FIG. 2, in the light-emitting diode according to an embodiment, a first conductivity type, for example, n type first cladding layer 1 made of GaN having a thickness of from, for example, about 3 μm to about 3.5 μm, an InGaN-based active layer 2 having a thickness of, for example, about 150 nm and a second conductivity type, for example, p type second cladding layer 3 made of GaN having a thickness of from, for example, about 100 nm to about 380 nm are laminated to construct a light-emitting function portion 4.

Then, a first electrode 11 is deposited on the side of the first cladding layer 1 in an ohmic contact fashion. This first electrode 11 is limitedly formed on a part so as to have a light transmission aperture 11W. Alternatively, although not shown, the first electrode 11 may be formed as a mesh-like electrode or it may be formed of a transparent electrode.

Also, a second electrode 12 formed of an Ag electrode with high reflectance is deposited on the side of the second cladding layer 3.

Then, in the arrangement according to an embodiment, the semiconductor layer on the side with which the second electrode 12 formed of the above-mentioned Ag electrode comes in contact, in this embodiment, the second cladding layer 3 is composed of a GaN layer of which dislocation density is selected to be less than $1\times10^7$ (1/cm$^2$), desirably, less than $1\times10^6$ (1/cm$^2$).

The semiconductor light-emitting diode having the arrangement in which at least the second cladding layer 3 with which the second electrode 12 formed of the Ag electrode comes in contact has the dislocation density selected to be less than $1\times10^7$ (1/cm$^2$), desirably, $1\times10^6$ (1/cm$^2$) can be constructed by a semiconductor layer formed according to an ELO (epitaxial lateral overgrowth) method which will be described below with reference to FIG. 3. The embodiment shown in FIG. 2 shows the arrangement of this case.

According to this arrangement, when the first and second electrodes 11 and 12 are energized, light can be emitted from the active layer 2 by the arrangement of the light-emitting function portion 4. At that time, most of light traveled to and reflected by the second electrode 12 formed of the Ag electrode 12 may be emitted to the outside through the light transmission aperture 11W bored on the first electrode 11 as shown by an open arrow a in FIG. 2.

Figure 3:
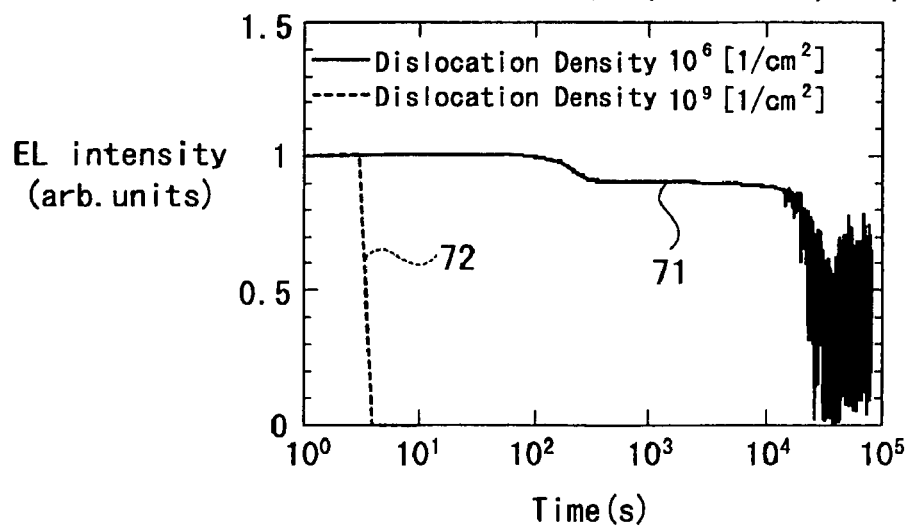
FIG. 3 is a diagram showing measured results of relationships among dislocation densities and aging characteristics according to an embodiment of the present invention and the related art arrangement.

FIG. 3 is a characteristic graph showing, in contrast, results obtained when aging characteristics were measured with application of a DC current 1 mA, that is, continuous light-emission in the case where the dislocation density was selected to be $1\times106$ (1/cm$^2$) and the ordinary dislocation density was selected to be $1\times109$ (1/cm$^2$) when the chip size (diameter) of this semiconductor light-emitting diode was selected to be 14 μm. A solid-line curve 71 in FIG. 3 shows measured results of characteristics an embodiment of the present invention, and a broken-like curve 72 shows measured results of characteristics obtained when the dislocation density was selected to be $1\times109$ (1/cm$^2$). In FIG. 3, the vertical axis represents relative values of luminous intensity where the initial value of the luminous intensity is selected to be 1, and the horizontal axis represents aging time in seconds. A study of the characteristic graph of FIG. 3 reveals that the life could be prolonged to 104 seconds according to the arrangement of the present invention in which the dislocation density was selected to be $1\times106$ (1/cm$^2$) while the life in which characteristics are rapidly deteriorated is only several seconds where the dislocation density was selected to be $1\times109$ (1/cm$^2$).

Figure 4:
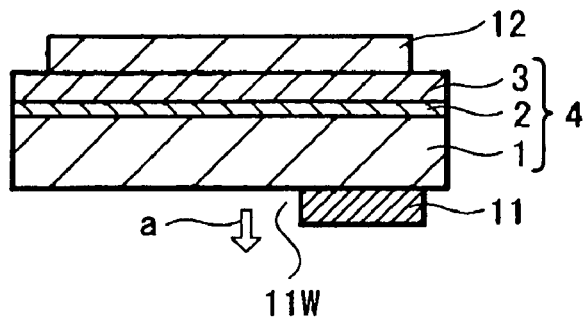
FIG. 4 is a schematic cross-sectional view showing a semiconductor light-emitting device according to another embodiment of the present invention.

FIG. 4 is a schematic cross-sectional view showing a semiconductor light-emitting device according to another embodiment. In FIG. 4, elements and parts identical to those of FIG. 2 are denoted by identical reference numerals.

According to this embodiment, the first conductivity type, for example, n type GaN first cladding layer 1, the InGaN-based active layer 2 and the second conductivity type, for example, p type GaN second conductivity type second cladding layer 3 are laminated on a GaN substrate 10 to construct the light-emitting function portion 4.

Then, the first electrode 11 having the light transmission aperture 11W is deposited on the side of the first cladding layer 1 in an ohmic contact fashion, and the second electrode 12 formed of the Ag electrode with high reflectance relative to a wavelength of emitted light is deposited on the side of the second cladding layer 3 in an ohmic contact fashion.

According to this arrangement, since the respective GaN-based semiconductor layers 1 to 3, each of which has a satisfactory lattice matching with the GaN substrate 10, are epitaxially deposited on the GaN substrate 10, the dislocation densities of these semiconductor layers 1 to 2 can be decreased sufficiently. Therefore, as described above, the dislocation density of at least the second cladding layer 3 formed of the Ag electrode can be made less than $1\times10^7$ (1/cm$^2$), desirably, $1\times10^6$ (1/cm$^2$).

According to this arrangement, when the first and second electrodes 11 and 12 are energized, light can be emitted from the active layer 2 by the arrangement of the light-emitting function portion 4. At that time, most of light traveled to and reflected on the second electrode 12 formed of the Ag electrode is emitted to the outside through the light transmission aperture 11W of the first electrode 11 as shown by the open arrow a in FIG. 4.

Next, a method of manufacturing a semiconductor light-emitting device according to an embodiment will be described with reference to FIGS. 5A to 5C, in which case a low dislocation semiconductor layer of a semiconductor light-emitting diode formed of the low dislocation semiconductor layer as shown in FIG. 2 is constructed by an ELO (epitaxial lateral overgrowth) method.

Figure 5A:
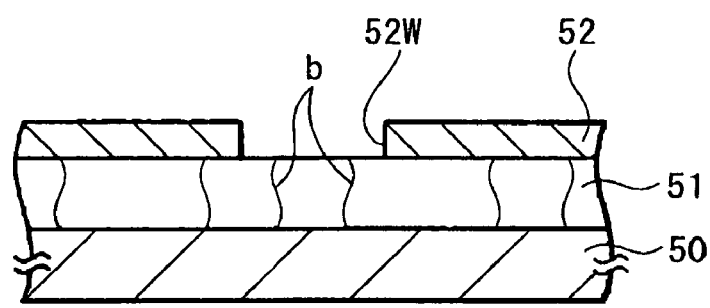
FIGS. 5A to 5C are respectively process diagrams of a method of manufacturing a semiconductor light-emitting diode according to an embodiment of the present invention.

First, as shown in FIG. 5A, a first epitaxial growth process is carried out, in which a first epitaxial growth semiconductor layer 51 is deposited on a sapphire substrate 50 having a thickness of about 430 μm, for example, in which GaN can be epitaxially deposited by depositing a first conductivity type, for example, n type GaN, for example, according to an MOCVD (metal organic chemical vapor deposition) method, for example. At that time, a dislocation, schematically shown by a narrow line b in FIG. 5A, is generated in the semiconductor layer 51.

An $SiO_2$ mask having a thickness of, for example, about 200 nm that inhibits the epitaxial growth on the first epitaxial growth semiconductor layer 51 is deposited on the first epitaxial growth semiconductor layer 51 by a plasma CVD (chemical vapor deposition) method. An aperture 52W is bored on this $SiO_2$ mask 52 by photolithography and etching and a part of the epitaxial growth semiconductor layer 51 is exposed to the outside through this aperture 52W.

Figure 5B:
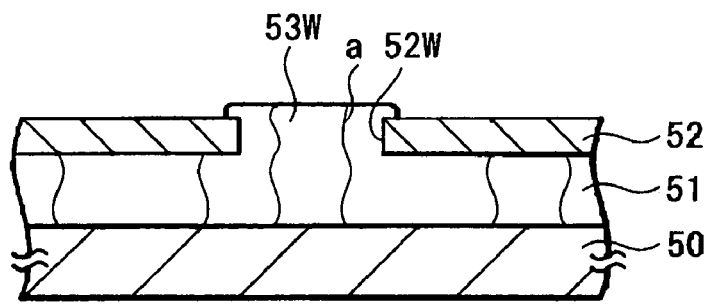

Next, as shown in FIG. 5B, according to a second epitaxial growth process, a first conductivity type, for example, n type GaN is epitaxially deposited by the MOCVD method. At that time, the first conductivity type, for example, n type GaN is not epitaxially deposited on the $SiO_2$ mask 52 but an epitaxial growth semiconductor layer 53W is deposited on the first epitaxial growth semiconductor layer 51 that is exposed through the aperture 52W to the outside.

Figure 5C:
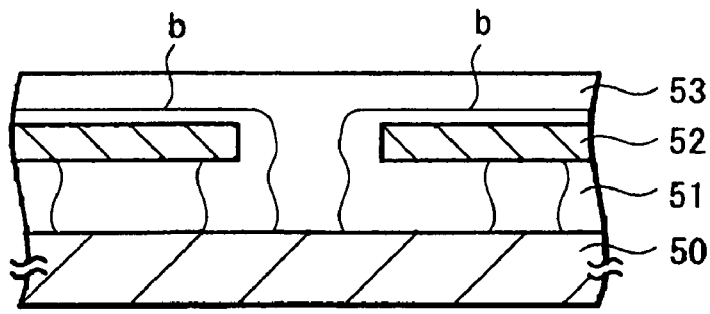

When this epitaxial growth is further carried out, as shown in FIG. 5C, a second epitaxial growth semiconductor layer 53 is deposited from the semiconductor layer 53W deposited on the aperture 52W to the $SiO_2$ mask 52. With respect to the dislocation defect in the second epitaxial growth semiconductor layer 53, a dislocation defect extended in the thickness direction as shown in FIG. 5B is bent in the direction in which the semiconductor layer is deposited, that is, the plane direction.

Accordingly, in this second epitaxial growth semiconductor layer 53, a dislocation which crosses its thickness direction is hardly generated and its apparent dislocation density can be decreased.

Consequently, according to this method, the dislocation density in this semiconductor layer 53 can be essentially made less than the above-mentioned numerical value, that is, $1\times10^7$ (1/cm$^2$). Further, the above dislocation density can be made less than $1\times10^6$ (1/cm$^2$).

Accordingly, the cladding layer 1, the active layer 2 and the second cladding layer 3 shown in FIG. 2, for example, are epitaxially deposited on the second semiconductor layer 53, in that order. The region in which the dislocation on the $SiO_2$ mask 52 is bent in the plane direction is used as the semiconductor light-emitting diode and the above-mentioned Ag electrode is deposited on this semiconductor light emitting diode, whereafter the target semiconductor light-emitting diode is separated.

Also, in this arrangement, the substrate 50 formed of the sapphire substrate, for example, and the $SiO_2$ mask 52 may be removed according to the need and the above-mentioned first electrode 11 may be formed on the surface from which the substrate 50 and the $SiO_2$ mask 52 were removed.

As described above, according to the semiconductor light-emitting diode device of an embodiment, since the dislocation density is decreased, although the second electrode 12 is formed of the Ag electrode, migration of Ag can be avoided effectively, whereby disadvantages such as the shortening of the life and the increase of the percentage of or fraction of defective devices can be avoided.

While the cases in which the InGaN-based semiconductor light-emitting device was the InGaN-based semiconductor light-emitting diode including the InGaN active layer have been described so far in the above-mentioned embodiments, the present invention is not limited thereto. For example, the problem of the above-mentioned migration arises also in an InAlGaN semiconductor light-emitting device and therefore the present invention can be applied to this InAlGaN semiconductor light-emitting device with similar effects being achieved.

The arrangement of the InAlGaN semiconductor light-emitting device can be made identical to that of the embodiments of the above-mentioned InGaN semiconductor light-emitting diode except that its active layer 2 is formed of InAlGaN.

Accordingly, this semiconductor light-emitting device also can effectively avoid the migration of Ag, whereby the disadvantages such as the shortening of the life and the increase of the fraction defective can be avoided.

According to the above-mentioned embodiments of the semiconductor light-emitting device, it was confirmed that the life of the semiconductor light-emitting device could be prolonged.

That is, it was investigated that the life of the semiconductor light-emitting device is shortened due to Ag migration caused by the Ag electrode. Also, this Ag migration occurs in such a manner that Ag is moved along the dislocations of crystals produced in the semiconductor layer with which the Ag electrode comes in contact, specifically, the second cladding layer, that is, the migration occurs in such a manner that it may reach the active layer or it may be extended to the position close to the active layer so that, when the light-emitting diode is energized, an electric current path which short-circuits the Ag electrode and the active layer is formed, the electric current being concentrated in this electric current path, thereby the above-mentioned semiconductor light-emitting device being broken all at once.

On the other hand, according to an embodiment, when the semiconductor layer on the contact side of the Ag electrode is held at the low dislocation density, specifically, the dislocation density of this semiconductor layer is selected to be less than $1\times10^7$ (1/cm$^2$), the life of the semiconductor light-emitting device could be prolonged.

Then, in the semiconductor light-emitting device according to an embodiment, when the size of this semiconductor light-emitting device, that is, the plane dimension is selected to be less than 20 μm, the life of the semiconductor light-emitting device can be prolonged much more as the low dislocation density is selected and the existence of the dislocation is decreased owing to microminiaturization of the semiconductor light-emitting device. Also, the percent or fraction of defective devices of the semiconductor light-emitting devices can be decreased. Accordingly, the yield thereof can be improved.

In other words, while the plane dimension of the light-emitting diode element of the related art semiconductor light-emitting device has a square pattern in which each side, for example, is 350 µm, the light-emitting diode element according to embodiments of the present invention an arrangement in which the diameter thereof or the length of each side is selected to be less than about 20 µm, in cooperation with the synergy in which the dislocation density is lowered and the probability that the dislocation will exist is decreased, it is possible to effectively decrease the existence of the substantial dislocation.

Therefore, when this low dislocation semiconductor layer has the epitaxial growth layer deposited by the ELO method or it has the epitaxial growth arrangement which is lattice-matched in the GaN semiconductor layer deposited on the GaN substrate, it is possible to obtain the above-mentioned dislocation density less than $1\times10^7$ (1/cm$^2$).

It should be understood by those skilled in the art that various modifications, combinations, sub-combinations and alterations may occur depending on design requirements and other factors insofar as they are within the scope of the appended claims or the equivalents thereof.

The invention is claimed as follows:

1. An InGaN-based semiconductor light-emitting device comprising:
   an epitaxial growth semiconductor layer formed by depositing a first growth layer on a substrate, forming a mask on the first growth layer that includes a plurality of apertures defining exposed portions of the first growth layer, continuing growth of the first growth layer on the exposed portions to form a low dislocation density second growth layer defining a top surface of the epitaxial growth semiconductor layer including dislocations bent in an in-plane direction of the epitaxial growth semiconductor layer, the epitaxial growth semiconductor layer having a bottom surface opposite to the top surface and formed by removing the mask and the substrate from the epitaxial growth semiconductor layer such that the epitaxial growth semiconductor layer consists of the second growth layer including said bent dislocations;
   an n-type cladding layer formed on the top surface of the epitaxial growth semiconductor layer;
   an active layer formed on the n-type cladding layer;
   a p-type cladding layer made of GaN and formed on the active layer;
   a p-side Ag electrode formed on the p-type cladding layer; and
   an n-side electrode formed on the bottom surface of the epitaxial growth semiconductor layer,
   wherein the entire p-type cladding layer and the epitaxial growth semiconductor layer have a dislocation density less than about $1\times10^6$(1/cm$^2$), and
   wherein a diameter or a length of a side of a planar dimension of said light-emitting device is less than about 20 µm.

2. The semiconductor light-emitting device according to claim 1, wherein the epitaxial growth semiconductor layer, the active layer and the n-type cladding layer form a laminated low dislocation epitaxial growth layer, wherein said laminated epitaxial growth layer is composed of a low dislocation epitaxial growth layer formed by an epitaxial lateral overgrowth method.

3. The semiconductor light-emitting device according to claim 1, wherein said InGaN-based semiconductor light-emitting device is formed by a low dislocation epitaxial growth method in which a laminated epitaxial growth layer including at least the p-type cladding layer, the active layer and the n-type cladding layer is formed on a GaN substrate.

4. The semiconductor light-emitting device according to claim 1, wherein the low dislocation density of the p-type cladding layer inhibits migration of Ag from the Ag electrode and through the p-type cladding layer to the active layer.

* * * * *